US012495557B2

United States Patent
Luo et al.

(10) Patent No.: US 12,495,557 B2
(45) Date of Patent: Dec. 9, 2025

(54) METHOD OF PREPARING PROGRAMMABLE DIODE, PROGRAMMABLE DIODE AND FERROELECTRIC MEMORY

(71) Applicant: Institute of Microelectronics, Chinese Academy of Sciences, Beijing (CN)

(72) Inventors: Qing Luo, Beijing (CN); Hangbing Lv, Beijing (CN); Ming Liu, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 373 days.

(21) Appl. No.: 18/249,890

(22) PCT Filed: Oct. 22, 2020

(86) PCT No.: PCT/CN2020/122841
§ 371 (c)(1),
(2) Date: Apr. 20, 2023

(87) PCT Pub. No.: WO2022/082605
PCT Pub. Date: Apr. 28, 2022

(65) Prior Publication Data
US 2023/0397429 A1 Dec. 7, 2023

(51) Int. Cl.
*H10B 51/30* (2023.01)
*H10B 99/00* (2023.01)
(Continued)

(52) U.S. Cl.
CPC ............. *H10B 51/30* (2023.02); *H10B 99/16* (2023.02); *H10D 8/00* (2025.01);
(Continued)

(58) Field of Classification Search
CPC .......... H10B 51/30; H10B 99/16; H10D 8/00; H10D 64/033; H10D 64/689; H10D 64/665; H10D 30/0415; H10D 30/701
(Continued)

(56) References Cited

U.S. PATENT DOCUMENTS

| 6,541,281 B2* | 4/2003 | Ramesh ................ H10B 53/00 257/295 |
| 2006/0073613 A1 | 4/2006 | Aggarwal et al. |
| 2020/0243687 A1* | 7/2020 | Ota .................... H01L 23/53266 |

FOREIGN PATENT DOCUMENTS

| CN | 1675769 A | 9/2005 |
| CN | 102683584 A | 9/2012 |

(Continued)

OTHER PUBLICATIONS

"Chinese Application Serial No. 202011152398.2, Office Action dated Sep. 28, 2022", (Sep. 28, 2022), 7 pgs.
(Continued)

*Primary Examiner* — Tu-Tu V Ho
(74) *Attorney, Agent, or Firm* — Schwegman Lundberg & Woessner, P.A.

(57) ABSTRACT

A method of preparing a programmable diode, including: forming a tungsten plug by a standard CMOS process; taking the tungsten plug as a lower electrode and depositing a functional layer material such as a ferroelectric film on the tungsten plug; depositing an upper electrode on the functional layer material; and patterning the upper electrode and a functional layer to complete a preparation of the programmable diode. The present disclosure further discloses a ferroelectric memory of a programmable diode prepared by the method of preparing a programmable diode. The method of preparing a programmable diode does not require growing a lower electrode and reduces a complexity of the process. The ferroelectric memory includes a transistor and
(Continued)

a programmable diode. This design stores information according to different polarities of the diode, thus a device area may be further reduced and a storage density may be improved.

7 Claims, 3 Drawing Sheets

(51) Int. Cl.
    *H10D 8/00*     (2025.01)
    *H10D 30/01*     (2025.01)
    *H10D 30/69*     (2025.01)
    *H10D 64/01*     (2025.01)
    *H10D 64/66*     (2025.01)
    *H10D 64/68*     (2025.01)

(52) U.S. Cl.
    CPC ....... *H10D 30/0415* (2025.01); *H10D 30/701* (2025.01); *H10D 64/033* (2025.01); *H10D 64/665* (2025.01); *H10D 64/689* (2025.01)

(58) Field of Classification Search
    USPC .......................................................... 257/295
    See application file for complete search history.

(56) References Cited

FOREIGN PATENT DOCUMENTS

| | | |
|---|---|---|
| CN | 102683585 A | 9/2012 |
| CN | 106910759 A | 6/2017 |
| CN | 109065712 A | 12/2018 |
| CN | 110544742 A | 12/2019 |
| JP | 08330451 A | 12/1996 |
| WO | WO-2011091709 A1 | 8/2011 |

OTHER PUBLICATIONS

"Chinese Application Serial No. 202011152398.2, Office Action dated Dec. 9, 2022", (Dec. 9, 2022), 4 pgs.

"Chinese Application Serial No. 202011152398.2, Office Action dated Apr. 26, 2022", (Apr. 26, 2022), 8 pgs.

"International Application No. PCT/CN2020/122841, International Search Report dated Jul. 7, 2021", (Jul. 7, 2021), 2 pgs.

\* cited by examiner

METHOD OF PREPARING PROGRAMMABLE DIODE, PROGRAMMABLE DIODE AND FERROELECTRIC MEMORY

PRIORITY APPLICATIONS

This application is a U.S. National Stage Filing under 35 U.S.C. $371 from International Application No. PCT/CN2020/122841, filed on Oct. 22, 2020, and published as WO2022/082605 on Apr. 28, 2022; the benefit of priority of which is hereby claimed herein, and which application and publication is hereby incorporated herein by reference in their entirety.

TECHNICAL FIELD

The present disclosure relates to a technical field of memory architecture design, in particular to a method of preparing a programmable diode, a programmable diode and a ferroelectric memory.

BACKGROUND

A ferroelectric material is widely used in microelectronics manufacturing and memory technology. In the existing technology, the ferroelectric material is mostly used for a ferroelectric memory. In the traditional integration architecture of ferroelectric memory, a transistor and a ferroelectric capacitor (1T1C) need to be integrated. In this 1T1C structure, the ferroelectric memory stores information based on a charge change of the capacitor, and its unit area is too large for high-density integration, and a reading is destructive. Therefore, there is an urgent need for a ferroelectric memory with a smaller device area and a higher storage density.

SUMMARY

In view of the above-mentioned technical problems, the present disclosure provides a method of preparing a programmable diode, a programmable diode and a ferroelectric memory to at least partially solve the above-mentioned technical problems.

In order to achieve the above-mentioned purpose, as an aspect of the present disclosure, there is provided a method of preparing a programmable diode, including:
  forming a tungsten plug by a standard CMOS process;
  taking the tungsten plug as a lower electrode and depositing a functional layer material such as a ferroelectric film on the tungsten plug;
  depositing an upper electrode on the functional layer material; and
  patterning the upper electrode and a functional layer to complete a preparation of the programmable diode.

The forming a tungsten plug by a CMOS process includes:
  forming a tungsten plug hole above a MOS device by photolithography and etching;
  depositing a diffusion barrier layer Ti/TiN with a thickness range of 3 nm to 50 nm;
  filling the hole with tungsten by plasma-enhanced chemical vapor deposition, wherein a thickness of tungsten is in a range of 50 nm to 5000 nm; and
  forming the tungsten plug through chemical-mechanical polishing, wherein a diameter of the tungsten plug is in a range of 20 nm to 90 nm.

The ferroelectric film is prepared by one of electron beam evaporation, chemical vapor deposition, pulsed laser deposition, atomic layer deposition or sputtering.

A material of the upper electrode includes W, Ru, Al, Ti or a conductive metal compound, and the conductive metal compound includes TIN, TaN, $IrO_2$, ITO or IZO.

The upper electrode is prepared by one of electron beam evaporation, chemical vapor deposition, pulsed laser deposition, atomic layer deposition or sputtering.

A thickness of the upper electrode is in a range of 5 nm to 200 nm.

As another aspect of the present disclosure, there is further provided a programmable diode prepared by the method described above.

As another aspect of the present disclosure, there is further provided a ferroelectric memory including the programmable diode described above and a transistor.

DETAILED DESCRIPTION OF EMBODIMENTS

The present disclosure provides a method of preparing a programmable diode, including:
  forming a tungsten plug by a standard CMOS process;
  taking the tungsten plug as a lower electrode and depositing a functional layer material such as a ferroelectric film on the tungsten plug;
  depositing an upper electrode on the functional layer material; and
  patterning the upper electrode and a functional layer to complete a preparation of the programmable diode.

The forming a tungsten plug by a CMOS process includes:
  forming a tungsten plug hole above a MOS device by photolithography and etching;
  depositing a diffusion barrier layer Ti/TiN with a thickness range of 3 nm to 50 nm;
  filling the hole with tungsten by plasma-enhanced chemical vapor deposition, wherein a thickness of tungsten is in a range of 50 nm to 5000 nm; and
  forming the tungsten plug through chemical-mechanical polishing, wherein a diameter of the tungsten plug is in a range of 20 nm to 90 nm.

The ferroelectric film is prepared by one of electron beam evaporation, chemical vapor deposition, pulsed laser deposition, atomic layer deposition or sputtering. A material of the upper electrode includes W, Ru, Al, Ti or a conductive metal compound, and the conductive metal compound includes TIN, TaN, $IrO_2$, ITO or IZO. The upper electrode is prepared by one of electron beam evaporation, chemical vapor deposition, pulsed laser deposition, atomic layer deposition or sputtering.

A thickness of the upper electrode is in a range of 5 nm to 200 nm.

In order to make purposes, technical solutions and advantages of the present disclosure more apparent and understandable, the present disclosure is further described in detail below in combination with specific embodiments and with reference to the accompanying drawings.

Figure 1:
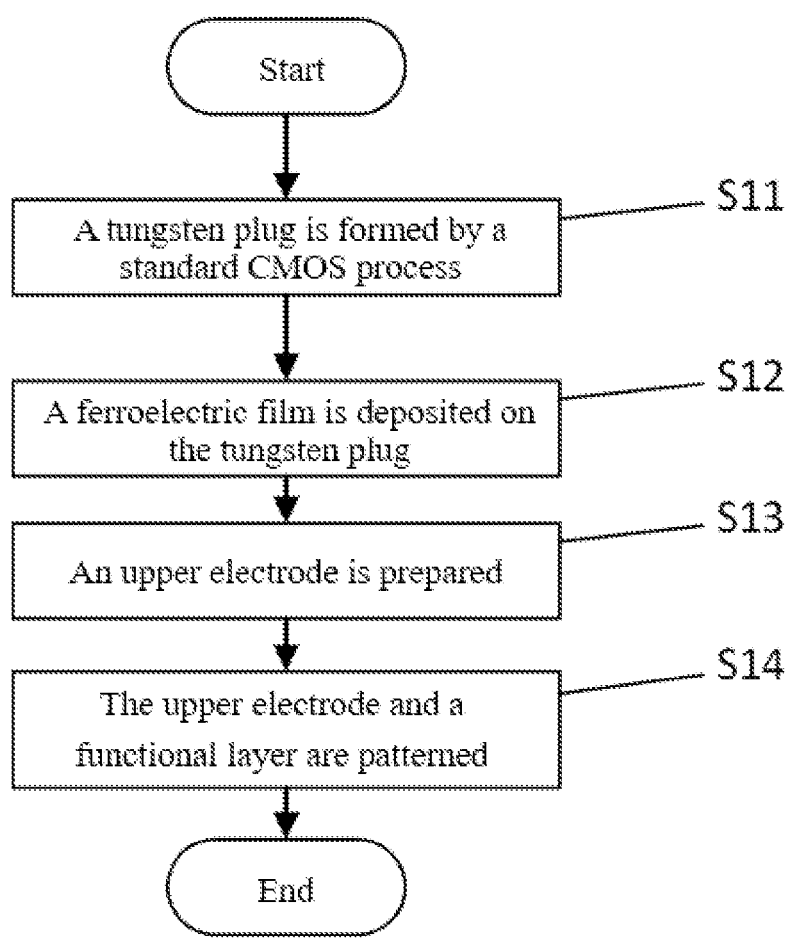
FIG. 1 shows a schematic flowchart of a method of preparing a programmable diode provided by embodiments of the present disclosure.

As shown in FIG. 1, FIG. 1 is a schematic flowchart of a method of preparing a programmable diode, including the following steps.

In S11, a tungsten plug is formed by a standard CMOS process.

Figure 2:
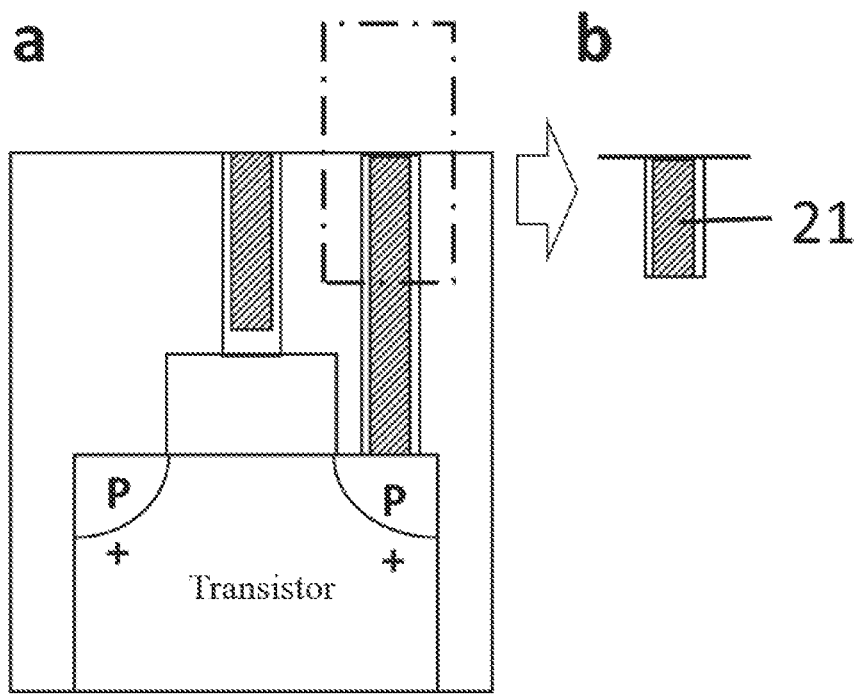
FIG. 2 shows a schematic diagram of step S11 in the method provided by embodiments of the present disclosure.

As shown in FIG. 2, step S11 includes: forming a tungsten plug hole above a MOS device by photolithography and etching;

depositing a diffusion barrier layer Ti/TiN with a thickness range of 3 nm to 50 nm;

filling the hole with tungsten by plasma-enhanced chemical vapor deposition (PECVD), wherein a thickness of tungsten is in a range of 50 nm to 5000 nm; and forming the tungsten plug 21 through chemical-mechanical polishing, wherein a diameter of the tungsten plug 21 is in a range of 20 nm to 90 nm.

Part a in FIG. 2 shows a sectional view after the tungsten plug 21 is completed through a conventional CMOS process. The subsequent process steps are performed on an upper surface of the tungsten plug 21 shown in part b of FIG. 2.

Figure 3:
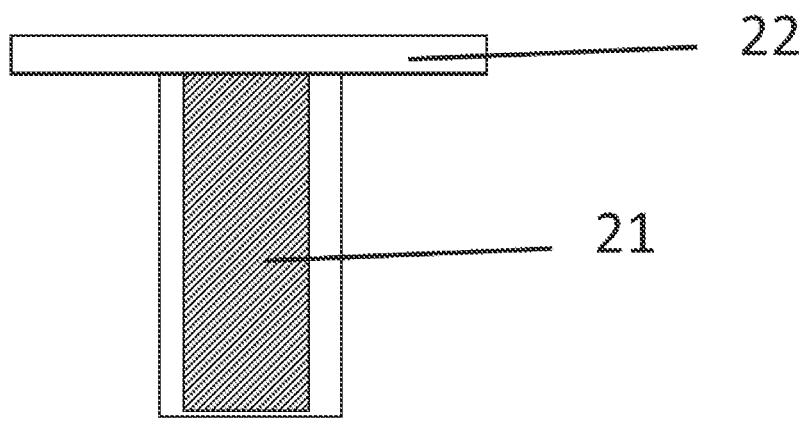
FIG. 3 shows a schematic diagram of step S12 in the method provided by embodiments of the present disclosure.

In S12, the tungsten plug is taken as a lower electrode, and a functional layer material such as a ferroelectric film 22 is deposited on the tungsten plug 21, as shown in FIG. 3.

The ferroelectric film 22 may be prepared by electron beam evaporation, chemical vapor deposition, pulsed laser deposition, atomic layer deposition or sputtering.

In this step, the tungsten plug is directly used as the lower electrode without additionally manufacturing the lower electrode, which may save the process steps and reduce the process complexity.

Figure 4:
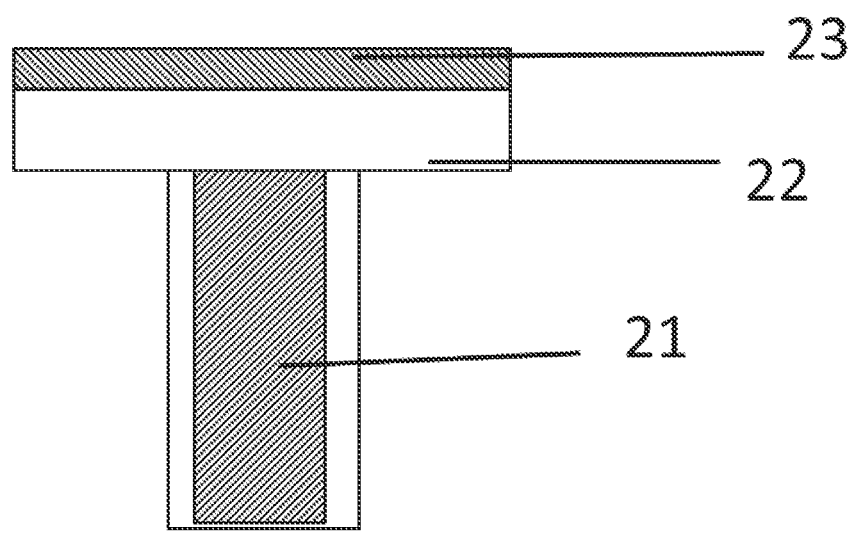
FIG. 4 shows a schematic diagram of step S13 in the method provided by embodiments of the present disclosure.

In S13, an upper electrode 23 is deposited on the functional layer material, as shown in FIG. 4.

A material of the upper electrode 23 includes, but not limited to W, Ru, Al, Ti or a conductive metal compound, and the conductive metal compound includes TiN, TaN, IrO$_2$, ITO or IZO.

The upper electrode 23 may be prepared by electron beam evaporation, chemical vapor deposition, pulsed laser deposition, atomic layer deposition or sputtering.

A thickness of the upper electrode 23 is in a range of 5 nm to 200 nm.

In S14, the upper electrode and a functional layer are patterned to complete a preparation of the programmable diode.

The present disclosure further proposes a programmable diode prepared by the method of preparing a programmable diode described above, and proposes a ferroelectric memory using the programmable diode. The ferroelectric memory includes a transistor and a programmable ferroelectric diode (1T1D). This design stores information according to different polarities of the diode, thus a device area may be further reduced and a storage density of the memory may be improved.

In summary, compared with the traditional method of preparing a programmable diode and ferroelectric memory, the method of preparing a programmable diode and ferroelectric memory in the present disclosure have at least one of the following beneficial effects compared with the existing technologies.

(1) The method of preparing a programmable diode proposed in the present disclosure does not require growing a lower electrode and reduces a complexity of the process.

(2) The ferroelectric memory proposed in the present disclosure includes a transistor and a programmable diode. This design stores information according to different polarities of the diode, thus a device area may be further reduced and a storage density may be improved.

The specific embodiments described above further explain objectives, technical solutions and beneficial effects of the present disclosure in detail, and it should be understood that the specific embodiments described above are only specific embodiments of the present disclosure, and should not be used to limit the present disclosure, and any modifications, equivalent substitutions, improvements and the like made within the spirit and principle of the present disclosure should be included in the protection scope of the present disclosure.

What is claimed is:

1. A method of preparing a programmable diode, comprising:

forming a tungsten plug by a standard CMOS process;

taking the tungsten plug as a lower electrode and depositing a functional layer material comprising a ferroelectric film on the tungsten plug;

depositing an upper electrode on the functional layer material; and patterning the upper electrode and functional layer material to complete a preparation of the programmable diode;

wherein the forming a tungsten plug by a CMOS process comprises:

forming a tungsten plug hole above a MOS device by photolithography and etching;

depositing a diffusion barrier layer Ti/TiN with a thickness range of 3 nm to 50 nm;

filling the hole with tungsten by plasma-enhanced chemical vapor deposition, wherein a thickness of tungsten is in a range of 50 nm to 5000 nm; and forming the tungsten plug through chemical-mechanical polishing, wherein a diameter of the tungsten plug is in a range of 20 nm to 90 nm.

2. The method of claim 1, wherein the ferroelectric film is prepared by one of electron beam evaporation, chemical vapor deposition, pulsed laser deposition, atomic layer deposition or sputtering.

3. The method of claim 1, wherein a material of the upper electrode comprises W, Ru, Al, Ti and conductive metal compounds TIN, TaN, IrO2, ITO and IZO.

4. The method of claim 1, wherein the upper electrode is prepared by one of electron beam evaporation, chemical vapor deposition, pulsed laser deposition, atomic layer deposition or sputtering.

5. The method of claim 1, wherein a thickness of the upper electrode is in a range of 5 nm to 200 nm.

6. A programmable diode prepared by the method of claim 1.

7. A ferroelectric memory comprising the programmable diode of claim 6 and a transistor.

* * * * *